(12) United States Patent
Patrick et al.

(10) Patent No.: US 8,216,418 B2
(45) Date of Patent: Jul. 10, 2012

(54) ELECTRODE ASSEMBLY AND PLASMA PROCESSING CHAMBER UTILIZING THERMALLY CONDUCTIVE GASKET AND O-RINGS

(75) Inventors: Roger Patrick, Mountain View, CA (US); Raj Dhindsa, San Jose, CA (US); Greg Bettencourt, Fremont, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 488 days.

(21) Appl. No.: 12/112,112

(22) Filed: Apr. 30, 2008

(65) Prior Publication Data

US 2008/0308229 A1    Dec. 18, 2008

Related U.S. Application Data

(63) Continuation-in-part of application No. 11/896,375, filed on Aug. 31, 2007, now Pat. No. 7,862,682.

(60) Provisional application No. 60/929,107, filed on Jun. 13, 2007.

(51) Int. Cl.
*C23F 1/00* (2006.01)
*H01L 21/306* (2006.01)
*C23C 16/00* (2006.01)

(52) U.S. Cl. ............... 156/345.34; 118/723 R

(58) Field of Classification Search ............. 156/345.34; 118/723 R
See application file for complete search history.

(56) References Cited

U.S. PATENT DOCUMENTS

| | | | |
|---|---|---|---|
| 3,783,173 A * | 1/1974 | Twomey | 174/356 |
| 4,595,484 A | 6/1986 | Giammarco et al. | |
| 4,654,754 A | 3/1987 | Daszkowski | |
| 4,782,893 A | 11/1988 | Thomas | |
| 4,792,378 A | 12/1988 | Rose et al. | |
| 4,820,371 A | 4/1989 | Rose | |
| 4,960,488 A | 10/1990 | Law et al. | |
| 5,518,758 A | 5/1996 | Tiburtius et al. | |
| 5,534,751 A | 7/1996 | Lenz et al. | |

(Continued)

FOREIGN PATENT DOCUMENTS

JP    2006324400 A    11/2006

(Continued)

OTHER PUBLICATIONS

International Search Report and Written Opinion pertaining to International application No. PCT/US2008/064488 dated Nov. 28, 2008.

(Continued)

*Primary Examiner* — Keath Chen
(74) *Attorney, Agent, or Firm* — Dinsmore & Shohl LLP

(57) ABSTRACT

The present invention relates generally to plasma processing and, more particularly, to plasma processing chambers and electrode assemblies used therein. According to one embodiment of the present invention, an electrode assembly is provided comprising a thermal control plate, a silicon-based showerhead electrode, a thermally conductive gasket, and a plurality of o-rings, wherein respective profiles of a frontside of the thermal control plate and a backside of the showerhead electrode cooperate to define a thermal interface. The thermally conductive gasket and the o-rings are positioned along this thermal interface with the o-rings separating the thermally conductive gasket from the showerhead passages such that the gasket is isolated from the showerhead passages. The gasket may facilitate heat transfer across the thermal interface from the showerhead electrode to the thermal control plate.

14 Claims, 3 Drawing Sheets

U.S. PATENT DOCUMENTS

| | | |
|---|---|---|
| 5,545,473 A | 8/1996 | Ameen et al. |
| 5,660,917 A | 8/1997 | Fujimori et al. |
| 5,679,457 A | 10/1997 | Bergerson |
| 5,932,007 A | 8/1999 | Li |
| 6,036,782 A | 3/2000 | Tanaka et al. |
| 6,050,216 A | 4/2000 | Szapucki et al. |
| 6,073,577 A | 6/2000 | Lilleland |
| 6,096,414 A | 8/2000 | Young |
| 6,123,775 A | 9/2000 | Hao et al. |
| 6,131,646 A | 10/2000 | Kelley |
| 6,165,612 A | 12/2000 | Misra |
| 6,170,432 B1 | 1/2001 | Szapucki et al. |
| 6,200,415 B1 | 3/2001 | Maraschin |
| 6,220,607 B1 | 4/2001 | Schneider et al. |
| 6,245,192 B1 | 6/2001 | Dhindsa et al. |
| 6,331,349 B1 | 12/2001 | Kalinoski et al. |
| 6,343,647 B2 | 2/2002 | Kim et al. |
| 6,365,063 B2 | 4/2002 | Collins et al. |
| 6,376,385 B2 | 4/2002 | Lilleland et al. |
| 6,379,491 B1 | 4/2002 | Lee et al. |
| 6,391,787 B1 | 5/2002 | Dhindsa et al. |
| 6,412,437 B1 | 7/2002 | Campbell et al. |
| 6,432,831 B2 | 8/2002 | Dhindsa et al. |
| 6,468,925 B2 | 10/2002 | Campbell et al. |
| 6,475,933 B1 | 11/2002 | Brown et al. |
| 6,491,784 B2 | 12/2002 | Yamaguchi et al. |
| 6,496,373 B1 | 12/2002 | Chung |
| 6,651,736 B2 | 11/2003 | Chiu et al. |
| 6,733,015 B2 | 5/2004 | Forry et al. |
| 6,786,175 B2 | 9/2004 | Dhindsa et al. |
| 6,818,097 B2 | 11/2004 | Yamaguchi et al. |
| 6,824,627 B2 | 11/2004 | Dhindsa et al. |
| 6,855,377 B2 | 2/2005 | Yajima et al. |
| 6,983,892 B2 | 1/2006 | Noorbakhsh et al. |
| 6,984,288 B2 | 1/2006 | Dhindsa et al. |
| 7,017,269 B2 | 3/2006 | White et al. |
| 7,018,506 B2 | 3/2006 | Hongoh et al. |
| 7,094,315 B2 | 8/2006 | Chen et al. |
| 7,137,444 B2 | 11/2006 | Faybishenko et al. |
| 7,159,537 B2 | 1/2007 | Wickramanayaka et al. |
| 7,205,050 B2 | 4/2007 | Haas |
| 7,208,192 B2 | 4/2007 | Bunyan et al. |
| 7,220,937 B2 | 5/2007 | Hofman et al. |
| 7,708,859 B2 | 5/2010 | Huang et al. |
| 7,712,434 B2 | 5/2010 | Dhindsa et al. |
| 7,732,728 B2 | 6/2010 | Dhindsa et al. |
| 7,854,820 B2 | 12/2010 | De La Liera et al. |
| 2001/0033059 A1 | 10/2001 | Forry et al. |
| 2002/0123230 A1 | 9/2002 | Hubacek |
| 2003/0106644 A1 | 6/2003 | Sirkis et al. |
| 2004/0187792 A1 | 9/2004 | Parks |
| 2005/0028935 A1 | 2/2005 | Wickramanayaka et al. |
| 2005/0133160 A1 | 6/2005 | Kennedy et al. |
| 2005/0145336 A1 | 7/2005 | Matsushima et al. |
| 2005/0241765 A1 | 11/2005 | Dhindsa et al. |
| 2005/0241766 A1 | 11/2005 | Dhindsa et al. |
| 2006/0054280 A1 | 3/2006 | Jang |
| 2006/0060138 A1 | 3/2006 | Keller et al. |
| 2006/0137607 A1 | 6/2006 | Seo et al. |
| 2006/0207502 A1 | 9/2006 | Dhindsa et al. |
| 2006/0253942 A1* | 11/2006 | Barrera et al. ............... 977/852 |
| 2006/0266852 A1 | 11/2006 | Choi |
| 2007/0066083 A1 | 3/2007 | Sadjadi et al. |
| 2007/0068629 A1 | 3/2007 | Shih et al. |
| 2007/0187038 A1 | 8/2007 | Ren et al. |
| 2008/0081114 A1* | 4/2008 | Johanson et al. ............ 427/273 |
| 2008/0090417 A1 | 4/2008 | De La Llera et al. |
| 2008/0141941 A1 | 6/2008 | Augustino et al. |
| 2008/0171444 A1 | 7/2008 | Dhindsa et al. |
| 2008/0242085 A1 | 10/2008 | Fischer et al. |
| 2008/0255294 A1* | 10/2008 | Yerushalmi-Rozen ....... 524/495 |
| 2008/0308229 A1 | 12/2008 | Patrick et al. |
| 2008/0318433 A1 | 12/2008 | Dhindsa et al. |
| 2009/0066035 A1* | 3/2009 | Hurlbert et al. ............... 277/592 |
| 2009/0081878 A1 | 3/2009 | Dhindsa |
| 2009/0095424 A1 | 4/2009 | Bettencourt et al. |
| 2009/0111276 A1 | 4/2009 | Dhindsa et al. |
| 2009/0236040 A1 | 9/2009 | Patrick et al. |
| 2009/0305509 A1 | 12/2009 | Stevenson et al. |
| 2010/0000684 A1 | 1/2010 | Kadkhodayan et al. |
| 2010/0003824 A1 | 1/2010 | Kadkhodayan et al. |
| 2010/0003829 A1 | 1/2010 | Patrick et al. |
| 2010/0040768 A1 | 2/2010 | Dhindsa |
| 2010/0124822 A1 | 5/2010 | Dhindsa et al. |
| 2010/0151687 A1 | 6/2010 | Dhindsa et al. |
| 2010/0159707 A1 | 6/2010 | Huang et al. |
| 2010/0184298 A1 | 7/2010 | Dhindsa |
| 2010/0261354 A1 | 10/2010 | Bettencourt et al. |
| 2011/0042879 A1 | 2/2011 | Kellogg et al. |

FOREIGN PATENT DOCUMENTS

| | | |
|---|---|---|
| JP | 2007123796 A | 5/2007 |
| JP | 2008103589 A | 5/2008 |
| KR | 20040007301 A | 1/2004 |
| KR | 20050043829 | 10/2006 |
| KR | 1020070015599 A | 2/2007 |
| WO | 2005065186 A2 | 7/2005 |

OTHER PUBLICATIONS

Glasgow et al., "Performance Testing of Thermal Interface Filler Materials in a Bolted Aluminum Interface Under Thermal/Vacuum Conditions", National Aeronautics and Space Administration, Jun. 2003.

The Berquist Company, "Thermal Materials: Sil-Pad Products", http://www/berquistcompany.com/tm_sil_pad-print.cfm?98d+104284, Jun. 13, 2007.

Office Action for U.S. Appl. No. 11/871,586 dated Nov. 20, 2009.

US Office Action dated Aug. 25, 2010 pertaining to U.S. Appl. No. 12/050,195.

US Office Action dated Mar. 26, 2010 pertaining to U.S. Appl. No. 11/871,586.

US Advisory Action dated Apr. 20, 2010 pertaining to U.S. Appl. No. 11/871,586.

U.S. Appl. No. 12/409,984, filed Mar. 24, 2009.

U.S. Appl. No. 11/871,586, filed Oct. 12, 2007.

U.S. Appl. No. 12/050,195, filed Mar. 18, 2008.

International Search Report and Written Opinion dated Aug. 27, 2009 pertaining to International application No. PCT/US2009/033060.

International Search Report and Written Opinion dated Jan. 9, 2009 pertaining to International application No. PCT/US2008/075676.

International Search Report and Written Opinion dated Oct. 6, 2010 pertaining to International application No. PCT/US2010/027273.

US Office Action dated Oct. 20, 2010 pertaining to U.S. Appl. No. 11/871,586.

U.S. Final Office Action dated Dec. 21, 2010 pertaining to U.S. Appl. No. 12/050,195.

Final Office Action dated Feb. 8, 2011 pertaining to U.S. Appl. No. 11/871,586.

Final Office Action dated Aug. 10, 2011 pertaining to U.S. Appl. No. 11/871,586, filed Oct. 12, 2007.

Office Action mailed Mar. 28, 2011 as it pertains to U.S. Appl. No. 11/871,586.

U.S. Non-Final Office Action dated Sep. 22, 2011 pertaining to U.S. Appl. No. 12/050,195.

Notice of Allowance mailed Feb. 10, 2012 as it relates to U.S. Appl. No. 12/050,195, filed Mar. 18, 2008.

Notice of Allowance dated Dec. 5, 2011 pertaining to U.S. Appl. No. 11/871,586, filed Oct. 12, 2007.

* cited by examiner

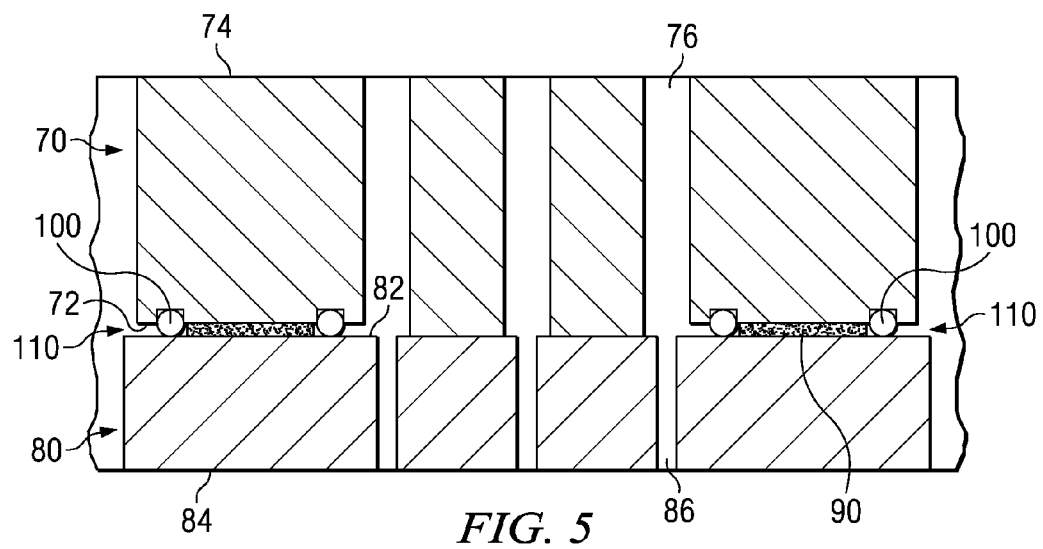

ELECTRODE ASSEMBLY AND PLASMA PROCESSING CHAMBER UTILIZING THERMALLY CONDUCTIVE GASKET AND O-RINGS

CROSS-REFERENCE TO RELATED APPLICATIONS

This application is a continuation-in-part of U.S. patent application Ser. No. 11/896,375, now U.S. Pat. No. 7,862,682, filed Aug. 31, 2007, which claims the benefit of U.S. Provisional Patent Application Ser. No. 60/929,107 filed Jun. 13, 2007.

BACKGROUND

The present invention relates generally to plasma processing and, more particularly, to plasma processing chambers and electrode assemblies used therein. Plasma processing apparatuses can be used to process substrates by a variety of techniques including, but not limited to, etching, physical vapor deposition, chemical vapor deposition, ion implantation, resist removal, etc. For example, and not by way of limitation, one type of plasma processing chamber contains an upper electrode, commonly referred to as a showerhead electrode, and a bottom electrode. An electric field is established between the electrodes to excite a process gas into the plasma state to process substrates in the reaction chamber.

BRIEF SUMMARY

According to one embodiment of the present invention, an electrode assembly comprises a thermal control plate, a silicon-based showerhead electrode, a thermally conductive gasket, and a plurality of o-rings. The thermal control plate comprises a frontside, a backside, and a plurality of process gas passages and the showerhead electrode comprises a frontside, a backside, and a plurality of showerhead passages. The thermal control plate and the showerhead electrode are engaged such that the frontside of the thermal control plate faces the backside of the showerhead electrode, while the plurality of process gas passages of the thermal control plate and the plurality of showerhead passages of the showerhead electrode cooperate to permit passage of a process gas through the electrode assembly. The respective profiles of the frontside of the thermal control plate and the backside of the showerhead electrode cooperate to define a thermal interface. The thermally conductive gasket and the o-rings are positioned along this thermal interface with the o-rings separating the thermally conductive gasket from the showerhead passages such that the gasket is isolated from the showerhead passages.

According to another embodiment of the present invention, a plasma processing chamber is provided comprising a vacuum source, a process gas supply, a plasma power supply, a substrate support, and an upper electrode assembly fabricated to incorporate one or more of the aspects of the present invention.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which:

FIG. 5 is a magnified illustration of the electrode assembly shown in FIG. 4.

Figure 1:
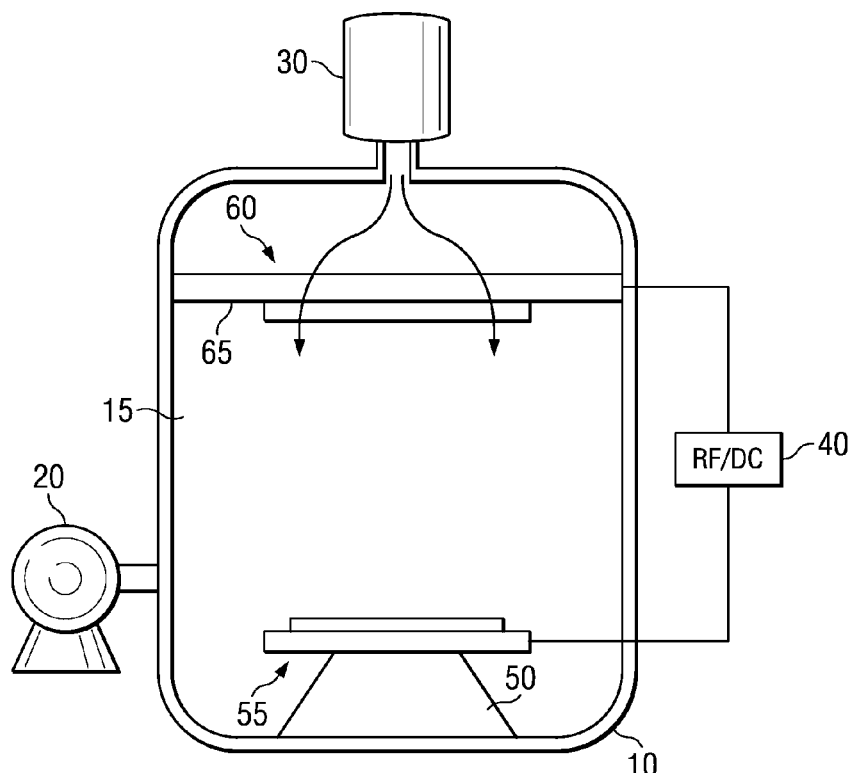
FIG. 1 is a schematic illustration of a plasma processing chamber incorporating particular aspects of some embodiments of the present invention.
Figure 2:
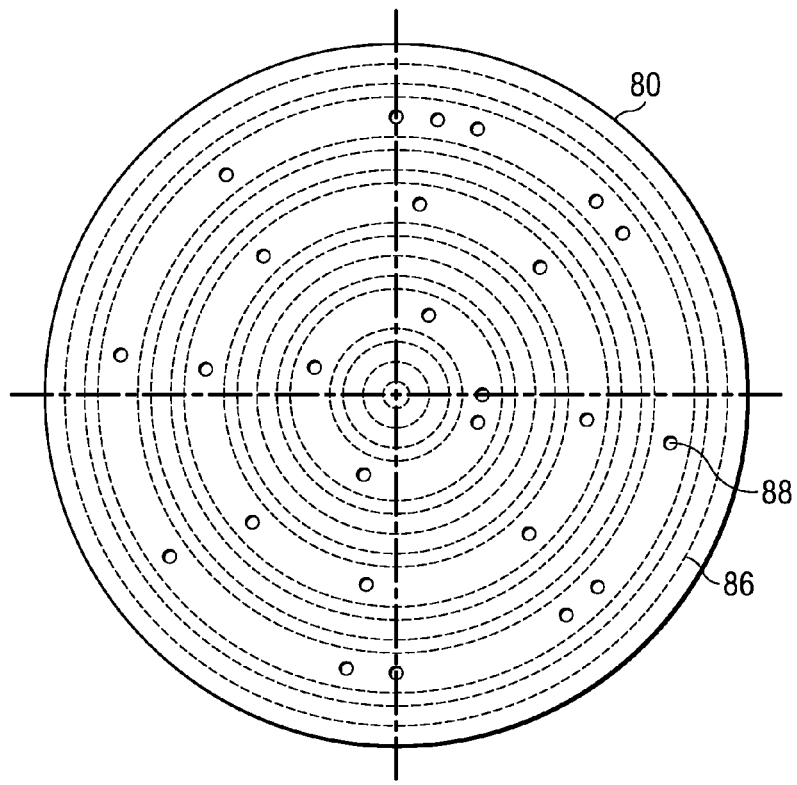
FIG. 2 is a plain view of the backside of a showerhead electrode according to one embodiment of the present invention.
Figure 3:
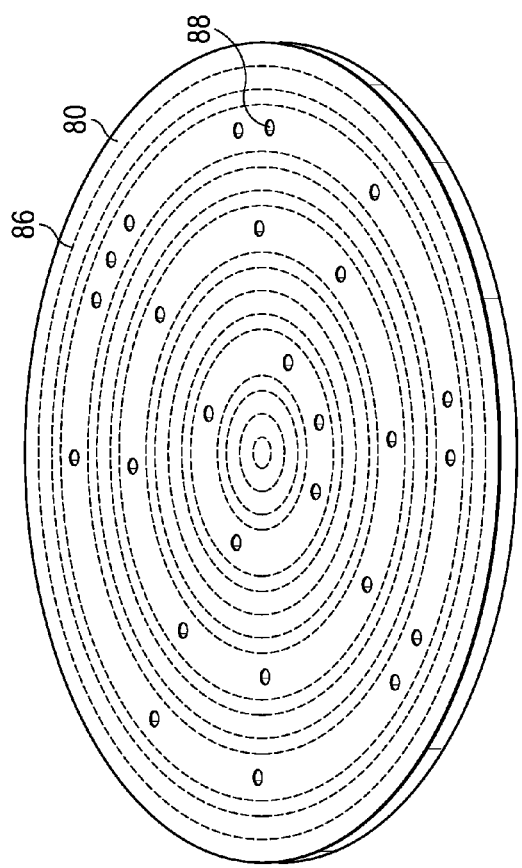
FIG. 3 is an isometric illustration of the backside and thickness dimensions of a showerhead electrode according to one embodiment of the present invention.

The embodiments set forth in the drawings are illustrative in nature and are not intended to be limiting of the invention defined by the claims. Moreover, individual aspects of the drawings and the invention will be more fully apparent and understood in view of the detailed description.

DETAILED DESCRIPTION

The various aspects of the present invention can be illustrated in the context of a plasma processing chamber 10, which is merely illustrated schematically in FIG. 1 to avoid limitation of the concepts of the present invention to particular plasma processing configurations, or components, that may not be integral to the subject matter of the present invention. As is generally illustrated in FIG. 1, the plasma processing chamber 10 comprises a vacuum source 20, a process gas supply 30, a plasma power supply 40, a substrate support 50 including a lower electrode assembly 55, and an upper electrode assembly 60.

Figure 4:
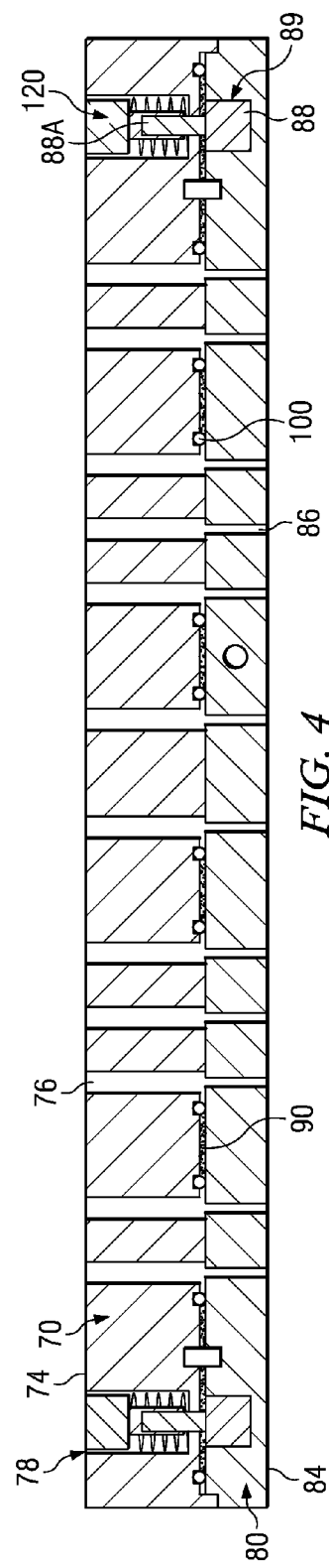
FIG. 4 is a cross sectional illustration of an electrode assembly according to one embodiment of the present invention.

Referring to FIGS. 4 and 5, embodiments of upper electrode assemblies 60 of the present invention are illustrated. Generally, the electrode assembly 60 comprises a thermal control plate 70, a silicon-based showerhead electrode 80, a thermally conductive gasket 90, and a plurality of o-rings 100. The thermal control plate 70 comprises a frontside 72, a backside 74, and a plurality of process gas passages 76. These process gas passages 76 typically extend from the backside 74 through the frontside 72 of the thermal control plate 70. Although the present invention is not limited to particular thermal control plate materials or process gas passage configurations, it is noted that suitable thermal control plate materials include aluminum, aluminum alloys, or similar thermal conductors. In addition, it is noted that a variety of teachings may be relied upon in the design of thermal control plates including, but not limited to, U.S. Pub. No. 2005/0133160.

The silicon-based showerhead electrode 80, shown in FIGS. 2-5, comprises a backside 82, a frontside 84, and a plurality of showerhead passages 86. These showerhead passages 86 typically extend from the backside 82 through the frontside 84 of the showerhead electrode 80. Although the present invention is not limited to particular silicon-based showerhead electrode materials or showerhead passage configurations, it is noted that suitable showerhead electrode materials include, but are not limited to, single crystal silicon, polysilicon, silicon nitride, silicon carbide, boron carbide, aluminum nitride, aluminum oxide, or combinations thereof. In addition, it is contemplated that the silicon-based showerhead electrode 80 may be presented in a variety of configurations without departing from the scope of the present invention including, but not limited to, a single-piece, circular showerhead configurations or multi-component, circular showerhead configurations comprising a circular central electrode and one or more peripheral electrodes arranged about the circumference of the central electrode.

As shown in FIGS. 4 and 5, the thermal control plate 70 and the showerhead electrode 80 are engaged such that the frontside 72 of the thermal control plate 70 faces the backside 82 of the showerhead electrode 80. In addition, the plurality of process gas passages 76 of the thermal control plate 70 and the plurality of showerhead passages 86 of the showerhead electrode 80 cooperate to permit passage of a process gas through the electrode assembly 60.

According to one embodiment, shown in FIGS. 4 and 5, the electrode assembly 60 is configured such that the respective profiles of the frontside 72 of the thermal control plate 70 and the backside 82 of the showerhead electrode 80 cooperate to define a thermal interface 110. According to this embodiment, the thermally conductive gasket 90 is positioned along the thermal interface 110 between the frontside 72 of the thermal control plate and the backside 82 of the showerhead electrode 80. It is contemplated that multiple thermally conductive gaskets 90 may be positioned along the thermal interface 110, however, generally, only a single gasket 90 is positioned along the thermal interface 110.

The positioning of the thermally conductive gasket 90 along the thermal interface 110 between the frontside 72 of the thermal control plate 70 and the backside 82 of the showerhead electrode 80 facilitates in the transfer of heat across the thermal interface 110 from the showerhead electrode 80 to the thermal control plate 70, generally under low contact pressure conditions. Generally, during plasma processing, the temperature of the silicon-based showerhead electrode 80 increases due to ion bombardment from the plasma. To provide greater control over the temperature of the showerhead electrode 80, the thermally conductive gasket 90 facilitates heat transfer from the showerhead electrode 80 to the thermal control plate 70. It is further contemplated that the thermally conductive gasket 90 may facilitate the transfer of heat across the thermal interface from the thermal control plate 70 to the showerhead electrode 80, generally under low contact pressure conditions, in order to maintain the showerhead electrode 80 at a specified temperature when not in use.

More particularly, as shown in FIGS. 4 and 5, the thermally conductive gasket 90 is in direct communication with the frontside 72 of the thermal control plate 70 and the backside 82 of the showerhead electrode 80. This direct communication of the thermally conductive gasket 90 with the frontside 72 of the thermal control plate 70 and the backside 82 of the showerhead electrode 80 promotes communication between the backside 82 of the showerhead electrode 80 and the frontside 72 of the thermal control plate 70 under low contact pressure such that the gasket 90 facilitates heat transfer across the thermal interface 110 defined by the showerhead electrode 80 and the thermal control plate 70.

To effectively transfer heat across the thermal interface 110, the gasket 90 generally is configured substantially of a thermally conductive material. For example, in one embodiment, the gasket may be a composite of aluminum foil coated with a thermally and electrically conductive rubber. One example of such a composite is Q-Pad II from the Bergquist Company. Thus, it is contemplated that the thermally conductive material may also be electrically conductive. According to one embodiment, the thermally conductive gasket 90 comprises carbon nanotube fillers. It is contemplated, however, that numerous other thermally, electrically conductive gaskets may be utilized in embodiments of the present invention to effectively transfer heat across the thermal interface 110.

As also shown in FIGS. 4 and 5, the electrode assembly 60 generally further comprises a plurality of o-rings 100. The o-rings 100 also are positioned along the thermal interface 110 and separate the gasket 90 from the showerhead passages 86 such that the gasket 90 is isolated from the showerhead passages 86 and, thus, also the process gas that may pass therethrough. As used herein, the term "isolated" means that the thermally conductive gasket 90 is both entirely physically separated from and at least substantially pneumatically sealed off from the showerhead passages and the process gas that may pass therethrough.

In addition, the o-rings 100 are configured to substantially prevent wearing of the gasket 90 through movement of the showerhead electrode 80, the thermal control plate 70, or both, and substantially prevent particles generated from the wearing of the gasket 90 from entering the showerhead passages 86. For example, dramatic temperature changes in electrode assemblies, which are often associated with plasma processing, may cause movement of the showerhead electrode 80, the thermal control plate 70, or both. More particularly, the molecular expansion and contraction of the showerhead electrode 80, the thermal control plate 70, or both, caused by changes in temperature can wear the gasket 90 positioned in the thermal interface 110 between showerhead electrode 80 and the thermal control plate 70, potentially causing particulate matter of the gasket 90 to slough off. The o-rings 100 can help prevent this wearing of the gasket 90 and prevent any sloughed-off particles of the gasket 90 from escaping into the showerhead passages 86 and interfering with the operation of the electrode assembly 60 and/or the plasma processing chamber 10.

Referring back to FIG. 1, according to another embodiment of the present invention, a plasma processing chamber 10 comprises a vacuum source 20, a process gas supply 30, a plasma power supply 40, a substrate support 50, and an upper electrode assembly 60. The vacuum source 20 is configured to at least partially evacuate the plasma processing chamber 10. The substrate support 50, meanwhile, is positioned in an evacuated portion 15 of the plasma processing chamber 10 and comprises a substrate electrode spaced from the upper electrode assembly 60. The substrate electrode and the upper electrode assembly 60 are operatively coupled to the plasma power supply 40. The upper electrode assembly 60 utilized in the plasma processing chamber 10 may be one of any embodiment of the electrode assembly 60 apparent in the detailed description and the claims of the present application. For example, in one embodiment, the plasma processing chamber 10 may comprise an electrode assembly defining a thermal interface 110 and comprising o-rings 100 positioned along the thermal interface 110 that separate a thermally conductive gasket from showerhead passages 86 of the electrode assembly 60.

The upper electrode assembly 60 within the plasma processing chamber 10 generally defines a hermetically sealed plasma partition 65 such that gas and reactive species within the evacuated portion 15 of the plasma processing chamber 10 do not penetrate beyond the plasma partition 65 and interfere with the operation of the electrode assembly 60 and/or the plasma processing chamber 10. The particular manner in which the plasma partition 65 is defined will vary depending on the respective configurations of the thermal control plate 70 and the showerhead electrode 80. It is contemplated that, in most cases, the respective materials forming the thermal control plate 70 and the showerhead electrode 80 will define the majority of the partition 65. In addition, it is contemplated that a variety of sealing members can be used to enhance the partition 65, particularly where the thermal control plate 70 and the showerhead electrode 80 interface with each other and with other components of the plasma processing chamber 10.

Further, referring to FIG. 4, the electrode assembly 60 generally also comprises securing hardware 120. More particularly, the thermal control plate 70 may comprise securing hardware passages 78 that are configured to permit securing hardware 120 to access the backside inserts 88 positioned in the partial recesses 89 along the backside 82 of the silicon-based showerhead electrode 80. The thermal control plate 70 and the silicon-based showerhead electrode 80 can be engaged using the securing hardware 120 and the backside inserts 88. In the engaged state, the securing hardware passages 78 are aligned with the backside inserts 88 positioned in the partial recesses 89 along the backside 82 of the showerhead electrode 80. As a result, the securing hardware 120 may extend through the securing hardware passages 78 in the thermal control plate 70 and engage the backside inserts 88, which are positioned in the partial recesses 89 along the backside 82 of the showerhead electrode 80.

The securing hardware 120 and the backside inserts 88 are configured to maintain engagement of the thermal control plate 70 and the silicon-based showerhead electrode 80 and to permit repeated, nondestructive engagement and disengagement of the thermal control plate 70 and the showerhead electrode 80. According to one embodiment, shown in FIG. 4, the backside insert 88 can be configured as a stud comprising a backside extension 88A that is configured to extend into one of the securing hardware passages 78 in the thermal control plate 70. In which case, the securing hardware 120 is configured to access the backside extension 88A of the backside insert 88 in the securing hardware passage 78 via, for example, a threaded engagement. According to another embodiment, the backside inserts 88 can be configured as anchors in the partial recesses 89 formed in the backside 82 of the showerhead electrode 80. With the insert 88 in place, the securing hardware 120, which may for example comprise a threaded screw or bolt, engages the backside insert 88 to secure the showerhead electrode 80 to the thermal control plate 70.

In any of the embodiments disclosed herein employing one or more backside inserts 88, it will often be advantageous to ensure that the securing hardware 120, the backside inserts 88, and the partial recess 89 are configured such that, during thermal loading, with the securing hardware 120 and backside insert 88 in an engaged state, the backside insert 88 is able to move with the securing hardware 120 within the partial recess 89 without dislodging from the recess 89.

Accordingly, in another embodiment, the insert 88 can be secured in the recess 89 in a spring-loaded state by providing a spring, the insert 88 being configured to allow for movement of the insert 88 in the partial recess 89 in the spring-loaded state. As a result, during the thermal loading typically present in plasma processing, the backside insert 88 can move with the securing hardware 120 within the partial recess 89 without dislodging from the recess 89 and without degrading the engagement of the securing hardware 120 and the insert 88.

A variety of spring-loaded configurations can be utilized to reduce any tendency of the securing hardware 120 to become disengaged as a result of stress induced as a result of thermal loading induced during plasma processing. For example, in one configuration for providing a spring-loaded engagement of the thermal control plate 70 and the showerhead electrode 80, the backside insert 88 is configured as an anchor in one of the partial recesses 89 formed in the backside 82 of the showerhead electrode 80 and the securing hardware 120 comprises a spring element in the form of a spring-loaded washer configured to oppose a force of engagement provided when the securing hardware 120 accesses the backside insert 88. In another configuration, the backside insert 88 may be omitted in favor of direct threaded engagement with a tapped hole in the electrode material. Alternatively, the spring element can be provided as a helical spring arranged about a longitudinal extension of the securing hardware 120 in the securing hardware passage 78.

It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "generally" and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present invention or to emphasize alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the open-ended preamble term "comprising."

What is claimed is:

1. An electrode assembly comprising a thermal control plate, a silicon-based showerhead electrode, and a thermally conductive gasket, wherein:

the thermal control plate comprises a frontside, a backside, and a plurality of process gas passages;

the silicon-based showerhead electrode comprises a frontside, a backside, and a plurality of showerhead passages;

the thermal control plate and the silicon-based showerhead electrode are engaged such that the frontside of the thermal control plate faces the backside of the silicon-based showerhead electrode;

the plurality of process gas passages of the thermal control plate and the plurality of showerhead passages of the silicon-based showerhead electrode cooperate to permit passage of a process gas through the electrode assembly;

the respective profiles of the frontside of the thermal control plate and the backside of the silicon-based showerhead electrode cooperate to define a thermal interface;

the thermally conductive gasket is positioned along the thermal interface between the frontside of the thermal control plate and the backside of the silicon-based showerhead electrode;

the thermally conductive gasket is in direct communication with silicon-based material of the silicon-based showerhead electrode; and the thermally conductive gasket comprises a composite of aluminum foil coated with a thermally and electrically conductive rubber.

2. The electrode assembly of claim 1, wherein the thermally conductive gasket is in direct communication with the frontside of the thermal control plate and the backside of the silicon-based showerhead electrode.

3. The electrode assembly of claim 2, wherein the direct communication of the thermally conductive gasket with the frontside of the thermal control plate and the backside of the silicon-based showerhead electrode promotes communication between the backside of the silicon-based showerhead electrode and the frontside of the thermal control plate such that the gasket facilitates heat transfer across the thermal interface defined by the silicon-based showerhead electrode and the thermal control plate.

4. An electrode assembly as claimed in claim 1 further comprising a plurality of o-rings wherein the o-rings are positioned along the thermal interface and separate the thermally conductive gasket from the showerhead passages such that the gasket is isolated from the showerhead passages.

5. The electrode assembly of claim 4, wherein the o-rings are configured to substantially prevent wearing of the thermally conductive gasket through movement of the silicon-based showerhead electrode, the thermal control plate, or both.

6. The electrode assembly of claim 5, wherein the o-rings are configured to substantially prevent particles generated from the wearing of the thermally conductive gasket from entering the showerhead passages.

7. An electrode assembly comprising a thermal control plate, a silicon-based showerhead electrode, and a thermally conductive gasket, wherein:

the thermal control plate comprises a frontside, a backside, and a plurality of process gas passages;

the silicon-based showerhead electrode comprises a frontside, a backside, and a plurality of showerhead passages;

the thermal control plate and the silicon-based showerhead electrode are engaged such that the frontside of the thermal control plate faces the backside of the silicon-based showerhead electrode;

the plurality of process gas passages of the thermal control plate and the plurality of showerhead passages of the silicon-based showerhead electrode cooperate to permit passage of a process gas through the electrode assembly;

the respective profiles of the frontside of the thermal control plate and the backside of the silicon-based showerhead electrode cooperate to define a thermal interface;

the thermally conductive gasket is positioned along the thermal interface between and in direct communication with the frontside of the thermal control plate and the backside of the silicon-based showerhead electrode;

the thermally conductive gasket is in direct communication with silicon-based material of the silicon-based showerhead electrode; and the thermally conductive gasket comprises a composite of aluminum foil coated with a thermally and electrically conductive rubber.

8. The electrode assembly of claim 7, wherein the direct communication of the thermally conductive gasket with the frontside of the thermal control plate and the backside of the silicon-based showerhead electrode promotes communication between the backside of the silicon-based showerhead electrode and the frontside of the thermal control plate such that the gasket facilitates heat transfer across the thermal interface defined by the silicon-based showerhead electrode and the thermal control plate.

9. An electrode assembly as claimed in claim 7 further comprising a plurality of o-rings wherein:

the o-rings are positioned along the thermal interface and separate the thermally conductive gasket from the showerhead passages such that the gasket is isolated from the showerhead passages; and the o-rings are configured to substantially prevent wearing of the thermally conductive gasket through movement of the silicon-based showerhead electrode, the thermal control plate, or both.

10. An electrode assembly as claimed in claim 9, wherein the o-rings are configured to substantially prevent particles generated from the wearing of the thermally conductive gasket from entering the showerhead passages.

11. A plasma processing chamber comprising a vacuum source, a process gas supply, a plasma power supply, a substrate support, and an upper electrode assembly, wherein:

the vacuum source is configured to at least partially evacuate the plasma processing chamber;

the substrate support is positioned in an evacuated portion of the plasma processing chamber and comprises a substrate electrode spaced from the upper electrode assembly;

the substrate electrode and the upper electrode assembly are operatively coupled to the plasma power supply;

the upper electrode assembly comprises a thermal control plate, a silicon-based showerhead electrode, and a thermally conductive gasket;

the thermal control plate comprises a frontside, a backside, and a plurality of process gas passages;

the silicon-based showerhead electrode comprises a frontside, a backside, and a plurality of showerhead passages;

the thermal control plate and the silicon-based showerhead electrode are engaged such that the frontside of the thermal control plate faces the backside of the silicon-based showerhead electrode;

the plurality of process gas passages of the thermal control plate and the plurality of showerhead passages of the silicon-based showerhead electrode cooperate to permit passage of a process gas through the electrode assembly;

the respective profiles of the frontside of the thermal control plate and the backside of the silicon-based showerhead electrode cooperate to define a thermal interface;

the thermally conductive gasket is positioned along the thermal interface between the frontside of the thermal control plate and the backside of the silicon-based showerhead electrode;

the thermally conductive gasket is in direct communication with silicon-based material of the silicon-based showerhead electrode; and the thermally conductive gasket comprises a composite of aluminum foil coated with a thermally and electrically conductive rubber.

12. A plasma processing chamber as claimed in claim 11, wherein:

the upper electrode assembly further comprises a plurality of o-rings; and the o-rings are positioned along the thermal interface and separate the thermally conductive gasket from the showerhead passages such that the gasket is isolated from the showerhead passages.

13. An electrode assembly comprising a thermal control plate, a silicon-based showerhead electrode, a thermally conductive gasket, and a plurality of o-rings, wherein:

- the thermal control plate comprises a frontside, a backside, and a plurality of process gas passages;
- the silicon-based showerhead electrode comprises a frontside, a backside, and a plurality of showerhead passages;
- the thermal control plate and the silicon-based showerhead electrode are engaged such that the frontside of the thermal control plate faces the backside of the silicon-based showerhead electrode;
- the plurality of process gas passages of the thermal control plate and the plurality of showerhead passages of the silicon-based showerhead electrode cooperate to permit passage of a process gas through the electrode assembly;
- the respective profiles of the frontside of the thermal control plate and the backside of the silicon-based showerhead electrode cooperate to define a thermal interface;
- the thermally conductive gasket is positioned along the thermal interface between the frontside of the thermal control plate and the backside of the silicon-based showerhead electrode;
- the thermally conductive gasket is in direct communication with silicon-based material of the silicon-based showerhead electrode;
  - the o-rings are positioned along the thermal interface and separate the thermally conductive gasket from the showerhead passages such that the gasket is isolated from the showerhead passages; and
  - the thermally conductive gasket comprises carbon nanotube fillers.

14. An electrode assembly comprising a thermal control plate, a silicon-based showerhead electrode, a thermally conductive gasket, and a plurality of o-rings, wherein:

- the thermal control plate comprises a frontside, a backside, and a plurality of process gas passages;
- the silicon-based showerhead electrode comprises a frontside, a backside, and a plurality of showerhead passages;
- the thermal control plate and the silicon-based showerhead electrode are engaged such that the frontside of the thermal control plate faces the backside of the silicon-based showerhead electrode;
- the plurality of process gas passages of the thermal control plate and the plurality of showerhead passages of the silicon-based showerhead electrode cooperate to permit passage of a process gas through the electrode assembly;
- the respective profiles of the frontside of the thermal control plate and the backside of the silicon-based showerhead electrode cooperate to define a thermal interface;
- the thermally conductive gasket is positioned along the thermal interface between and in direct communication with the frontside of the thermal control plate and the backside of the silicon-based showerhead electrode;
- the thermally conductive gasket is in direct communication with silicon-based material of the silicon-based showerhead electrode;
- the o-rings are positioned along the thermal interface and separate the thermally conductive gasket from the showerhead passages such that the gasket is isolated from the showerhead passages;
  - the o-rings are configured to substantially prevent wearing of the thermally conductive gasket through movement of the silicon-based showerhead electrode, the thermal control plate, or both; and
  - the thermally conductive gasket comprises carbon nanotube fillers.

* * * * *